(12) United States Patent
Grande et al.

(10) Patent No.: US 9,564,231 B2
(45) Date of Patent: Feb. 7, 2017

(54) NON-VOLATILE MEMORY DEVICE AND CORRESPONDING OPERATING METHOD WITH STRESS REDUCTION

(71) Applicant: STMICROELECTRONICS S.R.L., Agrate Brianza (MB) (IT)

(72) Inventors: Francesca Grande, Syracuse (IT); Alfredo Signorello, Tremestieri Etneo Catania (IT); SantiNunzioAntonino Pagano, Catania (IT); Maria Giaquinta, Catania (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/970,732

(22) Filed: Dec. 16, 2015

(65) Prior Publication Data
US 2016/0351264 A1    Dec. 1, 2016

(30) Foreign Application Priority Data
May 27, 2015  (IT) .......................... 102015000018393

(51) Int. Cl.
*G11C 8/08*    (2006.01)
*G11C 16/14*    (2006.01)
*G11C 16/08*    (2006.01)

(52) U.S. Cl.
CPC .............. *G11C 16/14* (2013.01); *G11C 16/08* (2013.01)

(58) Field of Classification Search
CPC ....................................................... G11C 8/08
USPC ..................................................... 365/185.23
See application file for complete search history.

(56) References Cited

U.S. PATENT DOCUMENTS

| | | | | |
|---|---|---|---|---|
| 2003/0198101 | A1* | 10/2003 | Pio ........................... | G11C 8/08 365/200 |
| 2004/0230736 | A1 | 11/2004 | Leconte et al. | |
| 2005/0105322 | A1 | 5/2005 | Kobayashi et al. | |
| 2009/0059678 | A1* | 3/2009 | Strenz ................ | G11C 16/0425 365/185.29 |
| 2011/0096602 | A1* | 4/2011 | Kim ....................... | G11C 16/34 365/185.11 |
| 2011/0299355 | A1* | 12/2011 | Rana ....................... | G11C 8/08 365/230.06 |

\* cited by examiner

*Primary Examiner* — Min Huang
(74) *Attorney, Agent, or Firm* — Allen, Dyer, Doppelt, Milbrath & Gilchrist, P.A.

(57) ABSTRACT

A non-volatile memory device includes a memory array with memory cells arranged in rows and columns. Each cell has respective current-conduction regions and a control-gate region. The control-gate regions of the memory cells of a same row are coupled to a control-gate terminal and biased at a respective control-gate voltage. A control-gate decoder selects and biases the control-gate regions of the rows at respective control voltages according to operations to be performed on the memory cells. The current-conduction regions of the memory cells are arranged within a same bulk well, and the control-gate decoder has a number of driver blocks each of which supplies the control-gate voltages to a respective number of rows of the array. The driver blocks are provided in respective biasing wells, separate and distinct from one another.

23 Claims, 6 Drawing Sheets

NON-VOLATILE MEMORY DEVICE AND CORRESPONDING OPERATING METHOD WITH STRESS REDUCTION

FIELD OF THE INVENTION

The present invention relates to a non-volatile memory device, and to a corresponding operating method with stress reduction.

BACKGROUND

Non-volatile memories, such as flash memories, for example, carry out erase operations with the application of high biasing voltages on the bulk of the substrate in which the memory array is integrated. In particular, this may be done for implementing the Fowler-Nordheim tunnel effect.

In the case of page-mode flash memories, the erase operations may further be carried out by page, i.e., involving all the memory cells of a same row of the array. Reference will be made in what follows to this case, without implying any loss of generality.

FIG. 1 shows, by way of example, the transistor structure of a memory cell 1 belonging to a memory array of a non-volatile memory device of a flash type (not illustrated). The memory cell 1 is provided in a substrate 2 of semiconductor material, for example, with N-type doping. The substrate 2 has a top surface 2a, a well 3, in the example P-type doping is provided in the substrate 2, defining the bulk (B) of the memory cell 1.

The memory cell 1 comprises a source region (S) 4 and a drain region (D) 5, which define the current-conduction terminals of the transistor, and which are both provided within the well 3, with opposite doping. In the example, N-type doping is provided for the well. A floating-gate region (FG) 6 is set above the top surface 2a of the substrate 2 and is separated from the latter by a tunnel-oxide region 7. A control-gate region (CG) 8 defines the control terminal CG of the transistor and is set above the floating-gate region 6 and is separated from the latter by a gate-oxide region 9.

During operation, data stored in the memory cell 1 is a function of an electrical charge $Q_{FG}$ stored in the floating-gate region 6. Erasing the memory cell 1 requires removal of the electrical charge $Q_{FG}$ by extraction of electrons from the same floating-gate region 6.

The above extraction of electrons is obtained by applying a high electrical field between a bulk terminal B of the memory cell 1 connected to the well 3, and a control-gate terminal CG of the memory cell 1 connected to the control-gate region 8. This is to activate the Fowler-Nordheim tunnel effect through the tunnel-oxide region 7 and to determine migration of the electrons through the same tunnel-oxide region 7.

In particular, the high electrical field required for the erase operation is generated by applying a high potential difference between the control-gate terminal CG and the bulk terminal B.

In one implementation, the control-gate terminal CG has a control voltage $V_{CG}$ set at a negative high-voltage value −HV, for example, −10 V. The bulk terminal B has a bulk voltage $V_B$ set at a positive high-voltage value +HV, for example, +10 V.

In a known way, not described in detail herein, the biasing voltages are generated by an appropriate decoding circuitry, including MOSFETs, coupled to the memory array.

As illustrated in FIG. 2a (which shows the plot of the drain-to-source current $I_{DS}$ versus the gate-to-source voltage $V_{GS}$ of the memory cell 1), following the erase operation, the electrical charge $Q_{FG}$ stored in the floating-gate region 6 undergoes a reduction. The electrical charge $Q_{FG}$, passes from a first (negative) value $Q_{FG}'$ (with the memory cell 1 in the programmed state) to a second value, in the example zero or positive, $Q_{FG}''$, indicating the erased state of the memory cell 1. Following the erase operation, a corresponding reduction of the threshold voltage (generally designated by $V_{th}$) occurs.

Operation of the memory cell 1 described above may lead to a considerable degree of stress in the memory cells that share the same bulk as the memory cell 1, given the high biasing voltage of the bulk terminal B.

Furthermore, even if the transistors in the memory device (for example, the MOSFETs in the decoding circuitry) have high-voltage characteristics (for example, they have suitable thicknesses of the gate oxides and suitable geometrical dimensions), they are able to withstand, without undergoing damage or failure, a maximum voltage between their own gate, source, and drain terminals. In flash-memory devices, this maximum value of voltage is, for example, 10 V (i.e., equal to the high-voltage value HV).

When a memory cell 1 is selected for erasing (by bringing the control voltage $V_{CG}$ to the negative high-voltage value −HV, −10 V in the example, and the bulk voltage $V_B$ to the positive high-voltage value +HV, +10 V in the example), the control-gate terminal of the other memory cells 1 that have not been selected may not be driven by the same decoding circuitry (and by the same MOSFETs) to a voltage higher than 0 V. This is done to not generate voltage differences between the terminals of the transistors that are higher than the high voltage HV (which represents the maximum voltage that may be withstood).

Consequently, in the non-selected memory cells 1 an undesirable phenomenon of loss of charge, the so-called soft erase, occurs on account of the high voltage. In the example this is +10 V, present between the control-gate terminals (set, for example, at 0 V) and the bulk terminals (set, for example, at +10 V).

As illustrated in FIG. 2b, the erase operation thus entails a reduction of the electrical charge $Q_{FG}$ stored in the floating-gate region 6 also of the non-selected memory cells 1, as represented by a dashed line, to a value $Q_{FG}$ between the first value $Q_{FG}'$ and the second value $Q_{FG}''$.

The programmed memory cells thus require, to prevent any losses of the data stored, periodic refresh operations, with a refresh frequency that depends on the number of erase cycles carried out on the other rows, during which the same memory cells 1 have remained non-selected.

The soft-erase stress acting on the non-selected memory cells 1 may be quantified by applying the following expression:

$$\text{Stress} = N \cdot R \cdot T_{er}$$

where N is the number of erase cycles, R is the number of rows involved in the erase cycles, and $T_{er}$ is the duration of the erase pulse.

To reduce this stress, which is defined in general as bulk stress, known non-volatile-memory devices use division of the memory array into a number of sectors (i.e., sectoring), each of which has an insulated bulk well. In the example illustrated previously, the insulated bulk wells have a P-type doping. In this way, in each sector, the stress that occurs during erase affects only the memory cells associated to the rows $R_{sec}$ belonging to the sector itself (with $R_{sec} < R$).

FIG. 3 shows a known non-volatile memory device 10, for example, of a flash type, divided into a plurality of sectors 12 physically distinct and electrically insulated from one another. Each sector 12 comprises a bulk well 14, provided within the substrate 2 of an N-type and having an opposite type of doping (in the example, a doping of a P-type). The various bulk wells 14 are insulated from one another. As an alternative, bulk wells 14 may be provided within a well of opposite doping, of an N-type, buried in the substrate 2.

Each sector 12 further comprises a respective plurality of rows of memory cells 1 (represented schematically) with the source and drain regions (not illustrated) provided within the respective bulk well 14, and arranged in rows (wordlines, WL) and columns (bitlines, BL). There is also a respective local control-gate decoder 16.

In particular, the control-gate terminals CG of the memory cells 1 of a same row are biased at a same control-gate voltage $V_{CG}$, and the local control-gate decoder 16 is configured to appropriately select and bias the control-gate terminals CG of the various rows of memory cells 1 at respective values of control voltage $V_{CG}$. This is to enable implementation of the programming, reading, and erase operations in the memory array.

The local control-gate decoders 16 are distinct and separate from one another, and are provided in the respective sector 12 of the memory array. Each sector 12 further comprises a respective local bitline decoder 18 configured to select and appropriately bias local bitlines BL, to which the drain terminals of the memory cells 1 of a same column are connected.

The local bitline decoder 18 comprises suitable selection transistors 19 (illustrated schematically in FIG. 3), which are controlled by selection signals, designated as a whole by SL. The selection signals are supplied by a controller of the non-volatile memory device 10, and are designed to couple the local bitlines BL to global bitlines of the memory array (the main bitlines), designated by MBL, that are in common for the various sectors 12.

This sectoring of the memory array, which, as has been pointed out, enables reduction of the stress in the memory cells 1 due to the erase operations, has, however, some disadvantages.

In particular, sectoring entails a considerable increase of the occupation area of the non-volatile memory device 10 on account of the need to separate from one another the various bulk wells 14, and further to provide in a distinct and separate manner the corresponding circuitries for row decoding and biasing and for column decoding and biasing.

It is thus required to reach a compromise between the number of sectors 12, and thus the number of rows associated to each sector 12, and the desired reduction of bulk stress. For example, known devices for a 1-MB memory using eight 128-KB sectors (or four 256-KB sectors), with a number of rows per sector equal to 512.

It is evident that, as the number of rows in each sector 12 increases (to prevent an excessive increase of area), the residual bulk stress due to the erase operations, which concerns all the non-selected rows within the sector 12, increases when a selected row is subjected to erase.

It is thus necessary to plan operations of refreshing of the rows of memory cells 1 following the erase operations, with a consequential increase in the times associated to the erase operations themselves.

Furthermore, a counter is to be provided for each sector 12 to monitor and keep under control the number of erase cycles and the number of refresh operations on the memory cells 1.

Non-volatile memory devices of a known type are not altogether satisfactory, for example, in regards to management of the erase operations and of the associated stresses in the memory cells, and in general, in the transistors of the same memory devices. There is a need to provide an improved approach for a non-volatile memory device, which will enable the problems highlighted above to be addressed.

SUMMARY

A non-volatile memory device includes a common well configured to be biased at a bulk voltage, and a memory array in the common well. The memory array may include a plurality of memory cells arranged in rows and columns, with each memory cell comprising a pair of current-conduction regions, a control-gate region between the pair of current-conduction regions, and a control-gate terminal coupled to the control-gate region. The control-gate terminal of a same row of memory cells may be coupled together and biased at a respective control-gate voltage. A control-gate decoder may be configured to select and bias the control-gate regions of the rows of memory cells and the respective control-gate terminals at the respective control-gate voltages. The control-gate decoder may comprise a plurality of biasing wells and a plurality of driver blocks in the plurality of biasing wells, with each biasing well being separate and distinct from one another and having a respective driver block therein, The plurality of driver blocks may be configured to supply the respective control-gate voltages to the rows of the memory cells.

Another aspect is directed to a method for operating a non-volatile memory device as described above. The method comprises operating a control-gate decoder to select and bias the control-gate regions of the rows of memory cells and the respective control-gate terminals at the respective control-gate voltages. The control-gate decoder may comprise a plurality of biasing wells and a plurality of driver blocks in the plurality of biasing wells, with each biasing well being separate and distinct from one another and having a respective driver block therein. The method may further comprise operating the plurality of driver blocks to supply the respective control-gate voltages to the rows of the memory cells.

BRIEF DESCRIPTION OF THE DRAWINGS

For a better understanding, preferred embodiments are now described, purely by way of non-limiting examples and with reference to the attached drawings, wherein.

DETAILED DESCRIPTION

As will be clarified in detail below, one aspect is the memory array of the non-volatile memory device being provided in a single bulk or common well (i.e., without physical sectoring), and with a virtual sectoring being implemented at the level of a control-gate decoder to enable appropriate biasing of the control-gate terminals CG of the memory cells of the various rows of the memory array. This advantageously reduces bulk stress.

Figure 4:
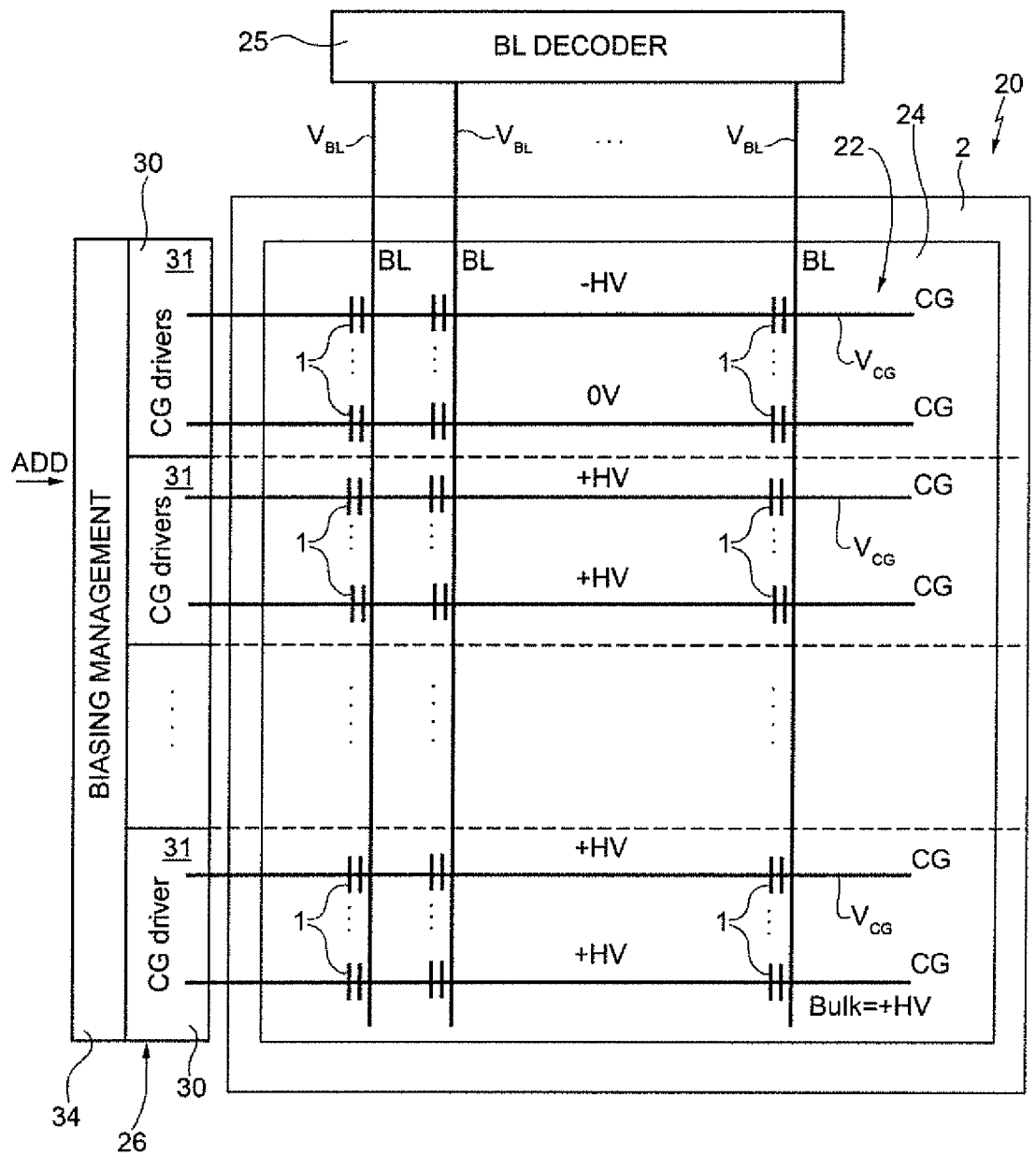
FIG. 4 shows a block diagram of a non-volatile memory device according to one embodiment of the present invention.

As illustrated in FIG. 4, a non-volatile memory device 20 comprises a memory array 22 provided in a single bulk or common well 24. The bulk well 24 may be directly in a substrate 2 of semiconductor material, or within a well with opposite doping, provided in the same substrate.

Figure 1:
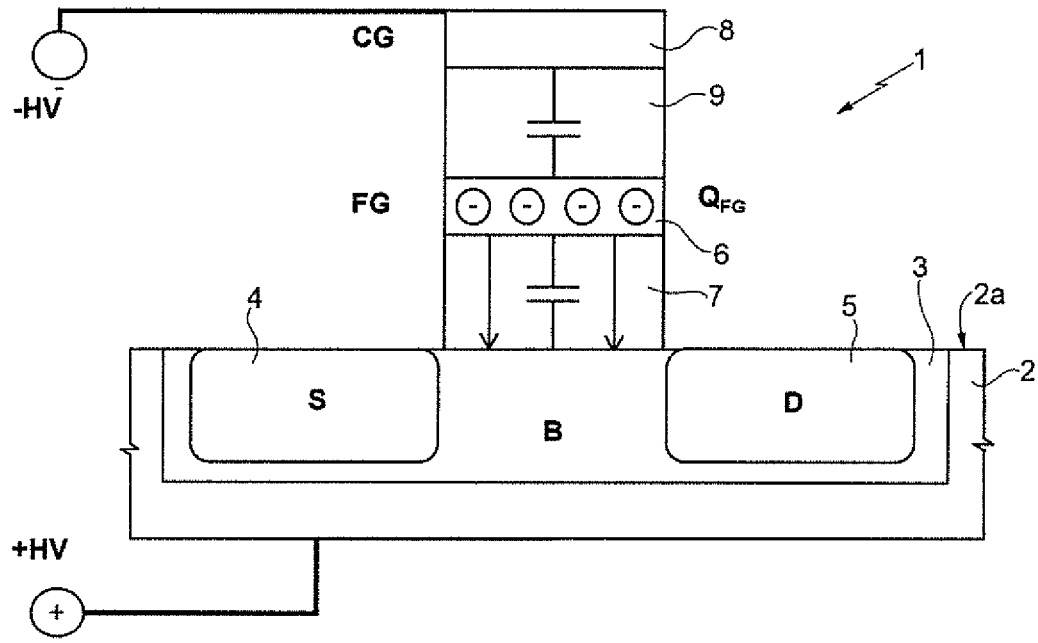
FIG. 1 is a schematic illustration of a memory cell of a non-volatile memory device according to the prior art.
Figure 2A:
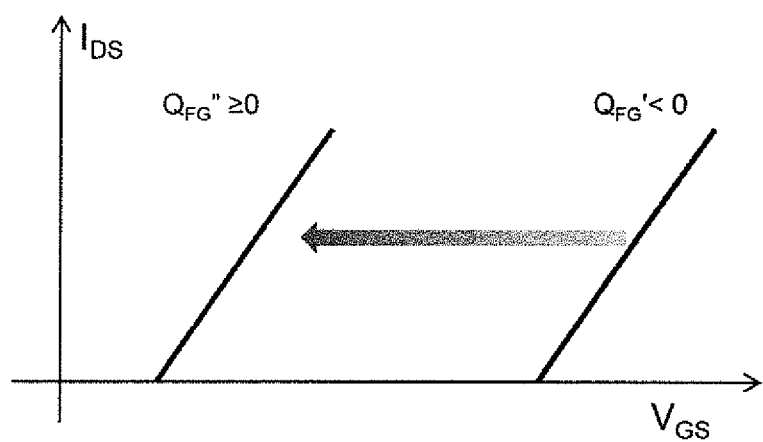
FIGS. 2a and 2b are plots representing amounts of charge stored in the memory cell of FIG. 1.
Figure 2B:
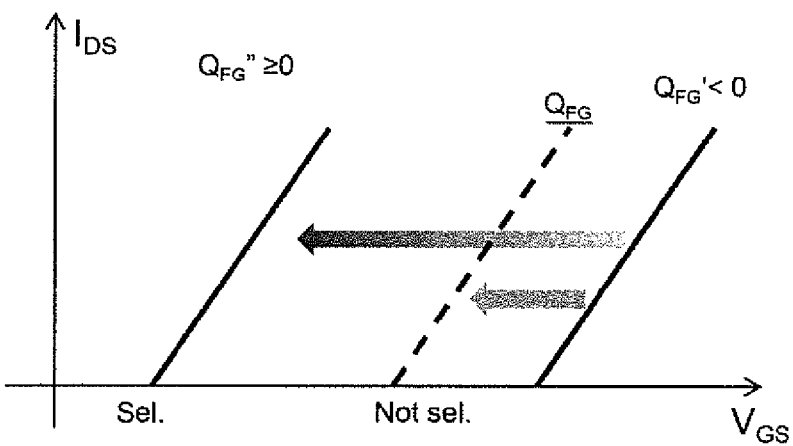

The memory array 22 comprises a plurality of memory cells 1, each of which may be made, for example, as described with reference to FIG. 1. Each memory cell 1 thus comprises respective current-conduction regions 4, 5 (source and drain regions) and a control-gate region 8.

The memory cells 1 are arranged in rows and columns. The control-gate terminals CG of the memory cells 1 of a same row is biased at a same control-gate voltage $V_{CG}$. The memory cells 1 of a same column coupled to a same bitline BL are set at a bitline voltage $V_{BL}$.

In this case, the non-volatile memory device 20 does not envisage distinction into local and global bitlines, and comprises a single column decoder 25 configured for selecting and appropriately biasing, on the basis of address signals received at input, the bitlines BL of the memory array 22 at desired bitline voltage values $V_{BL}$. To simplify the figures, the selection transistors for selection of the bitlines BL are not illustrated.

According to one aspect, the non-volatile memory device 20 further comprises a single control-gate decoder 26, configured for selecting and appropriately biasing the control-gate terminals CG of the rows of memory cells 1 of the memory array 22 at respective values of the control voltage $V_{CG}$, and in particular, during an erase operation.

Figure 3:
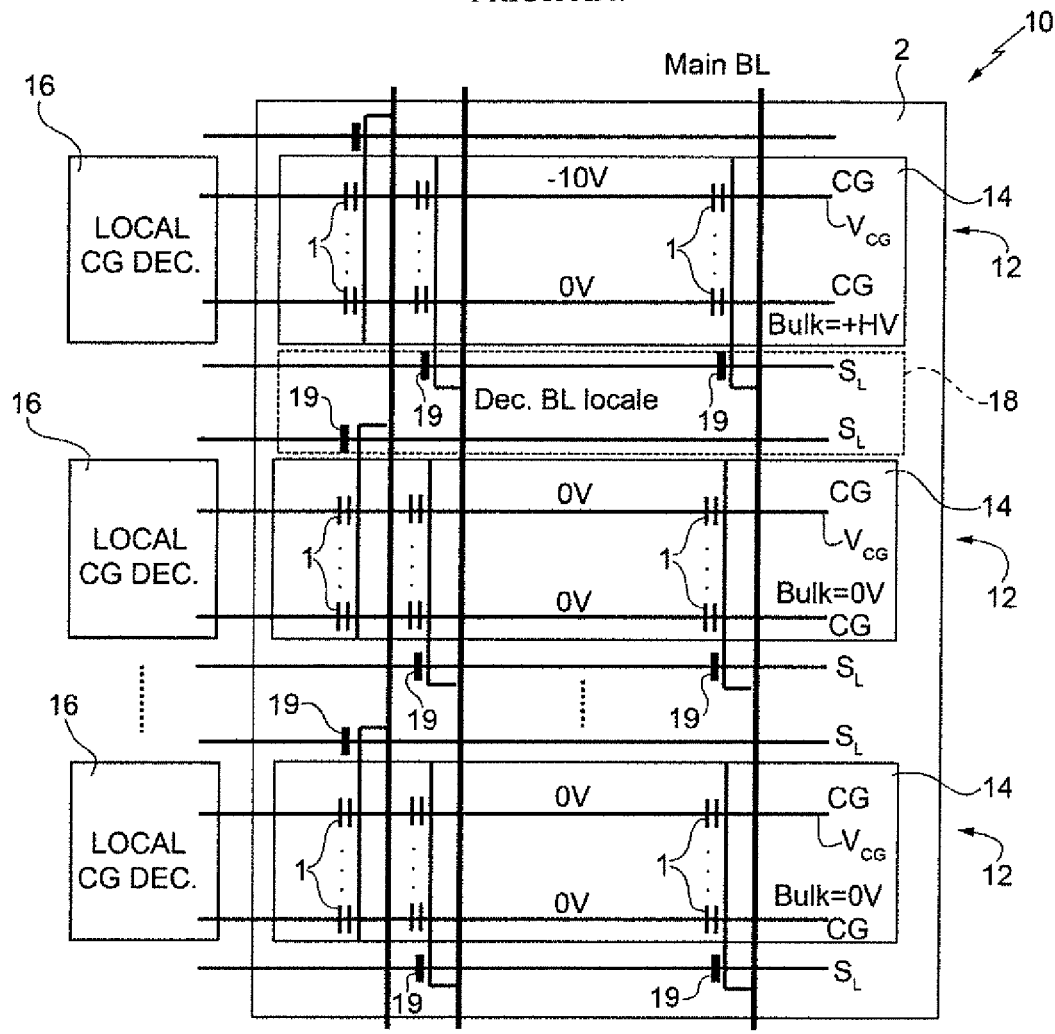
FIG. 3 shows a block diagram of a non-volatile memory device according to the prior art.

The single control-gate decoder 26 is configured to bias at least one selected row of memory cells 1 at an erase voltage, for example, as in the traditional approach discussed with reference to FIG. 3. This is done at a control voltage $V_{CG}$ set at a negative high-voltage value HV, for example, −10 V (with the bulk terminal B having a bulk voltage $V_B$ set at a positive high-voltage value +HV, for example, +10 V). The single control-gate decoder 26 is also configured to bias remaining rows of the memory array 22, not selected for erasing, at a control voltage $V_{CG}$ set at a stress-reduction value $V_{PP}$ equal or close to the bulk voltage $V_B$. In the example this is a positive high-voltage value +HV, equal or close to +10 V.

In this way, the potential difference between the control-gate terminals CG and bulk terminals B for the non-selected memory cells 1 is zero or in any case has a low value, such as not to cause soft programming stress. Soft programming stress is a substantial variation of the charge $Q_{FG}$ stored in the floating-gate region 6.

In particular, and as described in greater detail below, if the stress-reduction value $V_{PP}$ of the control voltage $V_{CG}$ is not equal to the bulk voltage $V_B$, it may differ from the bulk voltage $V_B$ by a value in the range [2 V÷3 V]. These values depend upon the technology.

As illustrated schematically in FIG. 4, according to a further aspect of the present solution, to prevent failure or damage to the MOSFETs in the control-gate decoder 26, individual driver stages of the control-gate decoder 26 (referred to as CG drivers in FIG. 4) are grouped in an appropriate number N of driver blocks 30. Each driver block 30 is coupled to a certain number M of rows of the memory array 22, which define a virtual sector. Each driver block 30 contains M driver stages. Each driver state is capable of driving a respective row of the virtual sector of the memory array 22.

The control-gate decoder 26 manages control voltages $V_{CG}$ between the negative high-voltage value −HV (in the example −10 V) and the stress-reduction value $V_{PP}$, which may be equal to the positive high-voltage value +HV (in the example +10 V). On account of the limits of voltage that may be withstood by the MOSFETs (at the most equal to the high voltage HV), the transistors of the various driver blocks 30 are provided in distinct and separate wells in the substrate of semiconductor material. That is, corresponding drain and source regions are provided within distinct wells, of an N or P type, for the MOSFETs of the various driver blocks 30.

Driver blocks 30 that operate in different voltage ranges, for example [−10 V, 0 V], in the case of a virtual sector of the memory array 22 in which an erase operation is carried out, or [0 V, +10 V], in the case of a virtual sector of the memory array 22 in which erase operations are not carried out, are thus obtained in distinct biasing wells 31. The distinct biasing wells 31 are illustrated schematically, and include the wells of an N and P type for the corresponding MOSFETs.

In this way, the MOSFETs provided in the biasing wells 31 do not experience differences of potential, between the corresponding terminals, higher than the high voltage HV.

For the reasons set forth, it is evident that a preferred approach from the standpoint of bulk stress reduction would envisage provision of a number N of distinct driver blocks 30 equal to the number M of the rows of the memory array 22 so that the driver stage that manages each row is provided in its own well (so as to have a substantially zero stress resulting from erase cycles).

However, a compromise in general is required between the need to reduce the number of biasing wells 31 and the resulting residual cycling stress on the one hand, and the occupation of area and the manufacturing complexity, on the other.

A good compromise between saving area and stress reduction may be obtained by coupling each driver block 30 to a number of rows between 32 and 128. The driver block 30 is thus capable of generating and managing a corresponding number of control-gate voltages $V_{CG}$. This is based on the hypothesis that the memory array 22 has dimensions between 512 KB and 1 MB.

Since sectoring is only virtual, the number of rows of the virtual sector is not in any case necessarily linked to the number of rows of the memory array 22. Rather, the maximum size of the memory array 22 may be limited by the length of the bitlines. For very large memories (>1 MB) provision of a number of memory banks with respective arrays and decoding circuits may be required.

As illustrated in FIG. 4, in this embodiment, a soft-erase stress may occur only in the rows associated to a same driver block 30 to which the row selected for erase is coupled to be biased. These rows may not in fact be biased, in the example, at a voltage higher than 0 V, in order to not incur a failure or breakdown of the corresponding MOSFETs.

Instead, the control voltage $V_{CG}$ of all the remaining rows is set by the remaining driver blocks 30 to the stress-reduction value $V_{PP}$ (in the example equal to the positive high-voltage value +HV), so as to annul or markedly reduce stress in the corresponding memory cells 1.

According to a further aspect, the control-gate decoder 26 further comprises a biasing-management stage 34, common to the various driver blocks 30. The biasing-management stage 34 is configured for generating the biasing voltages required of the MOSFETs of the same driver blocks for generation of the desired values of the control voltage $V_{CG}$.

The control-gate decoder 26 further receives at input low-voltage address signals ADD, from a controller (not illustrated) of the non-volatile memory device 20. The control-gate decoder 26 selects and biases the various rows of the memory array 22.

Figure 5A:
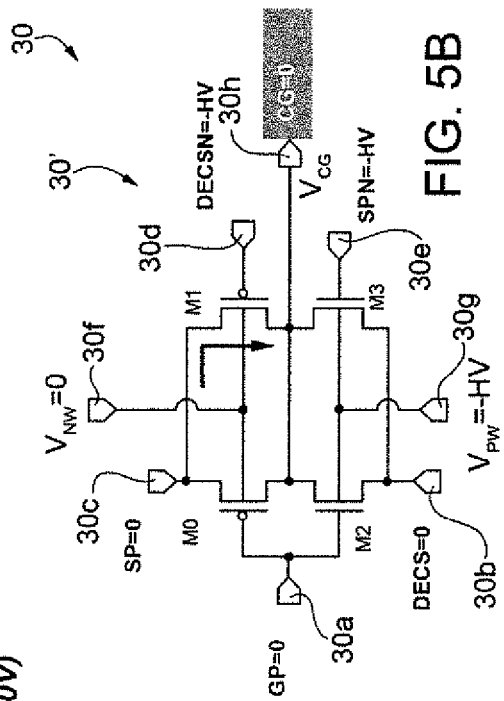
FIGS. 5a-5d and FIG. 6 show circuit diagrams of driver stages in the non-volatile memory device of FIG. 4.
Figure 5B:
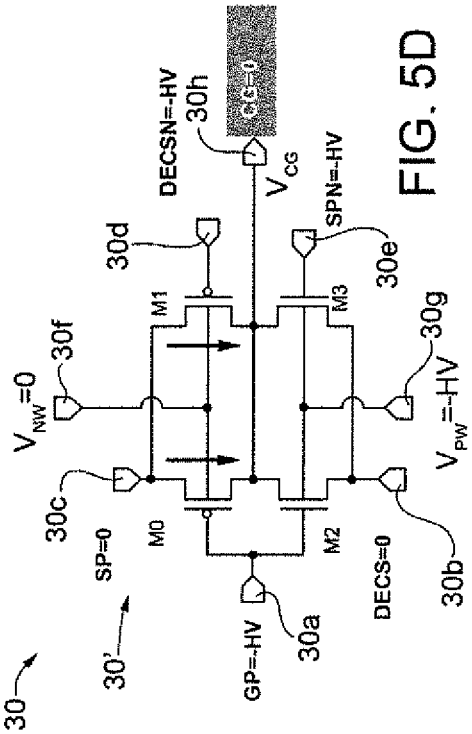
Figure 5C:
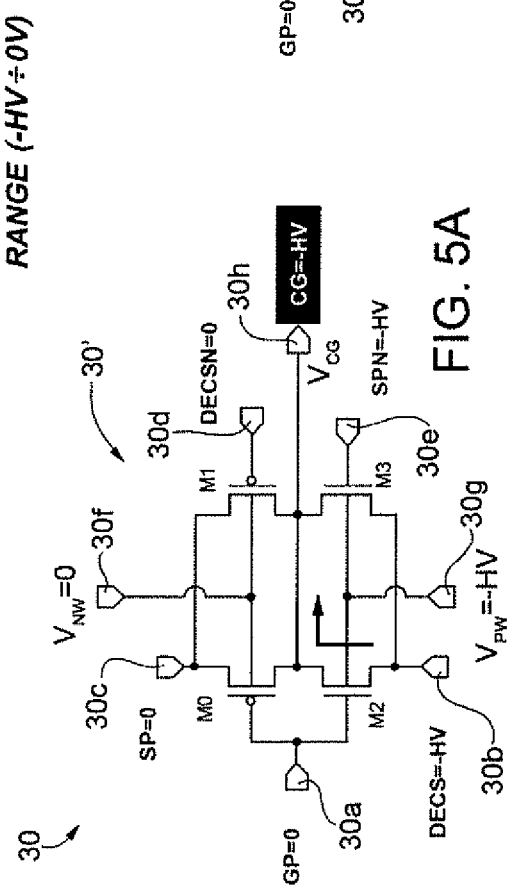
Figure 5D:
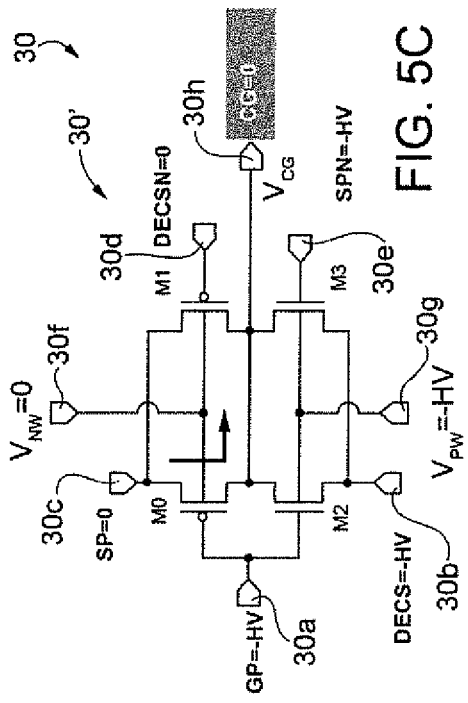
Figure 6:
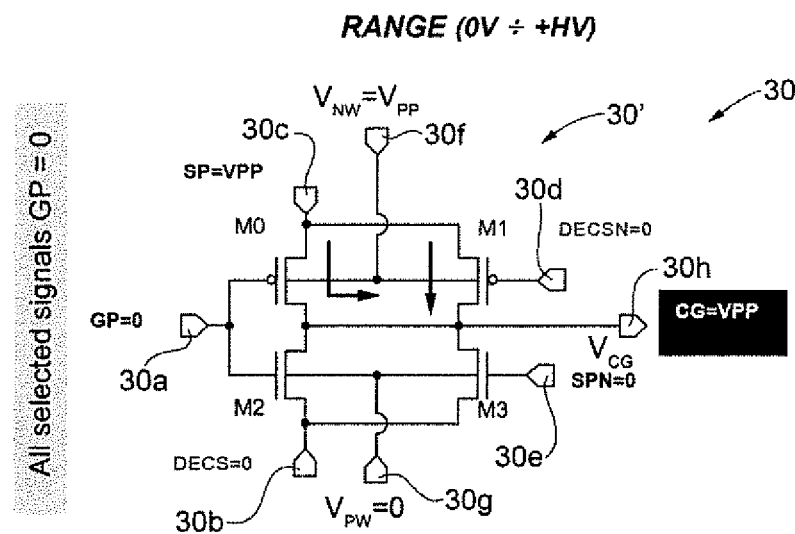

A more detailed description now follows, with reference to FIGS. 5a-5d and to FIG. 6, of a circuit configuration of a driver block 30, and the corresponding operation during the erase operations. Thus for the case where the driver block 30 comprises one driver stage selected for erase (FIGS. 5a) and M-1 driver stages not selected for erase (FIGS. 5b-5d), or does not comprise a driver stage selected for erase (FIG. 6).

In this embodiment, each driver stage, designated by 30', is implemented by a pair of high-voltage PMOS transistors, formed by a first PMOS transistor $M_0$ and by a second PMOS transistor $M_1$, and a pair of high-voltage NMOS transistors, formed by a first NMOS transistor $M_2$ and a second NMOS transistor $M_3$.

The driver stage 30' has a first input 30a to receive a first control signal GP, a second input 30b to receive a second control signal DECS, a third input 30c to receive a third control signal SP, a fourth input 30d to receive the negated version of the second control signal DECSN, a fifth input 30e to receive the negated version of the third control signal SPN, a sixth input 30f to receive an N biasing voltage $V_{NW}$ (for the N well of the PMOS transistors $M_0$ and $M_1$), a seventh input 30g to receive a P biasing voltage $V_{PW}$ (for the P well of the NMOS transistors $M_2$ and $M_3$), and an output 30h. The output 30h is to supply the control-gate voltage $V_{CG}$ to the control-gate terminals CG of a row of memory cells 1 of the memory array 22.

The first PMOS transistor $M_0$ has its gate terminal connected to the first input 30a, its source terminal connected to the third input 30c, and its drain terminal connected to the output 30h. The second PMOS transistor $M_1$ has its gate terminal connected to the fourth input 30d, its source terminal connected to the third input 30c, and its drain terminal connected to the output 30h. The first NMOS transistor $M_2$ has its gate terminal connected to the first input 30a, its source terminal connected to the second input 30b, and its drain terminal connected to the output 30h. The second NMOS transistor $M_3$ has its gate terminal connected to the fifth input 30e, its source terminal connected to the second input 30b, and its drain terminal connected to the output 30h.

The first and second PMOS transistors $M_0$ and $M_1$ further have their well terminals connected to the sixth input 30f. The first and second NMOS transistors $M_2$ and $M_3$ have their well terminals connected to the seventh input 30g.

As mentioned previously, the wells of the PMOS transistors $M_0$ and $M_1$ and of the NMOS transistors $M_2$ and $M_3$ of each driver stage 30' are shared with those of the other stages belonging to the same driver block 30, and are provided in respective biasing wells 31. The respective biasing wells 31 are distinct and separate from the biasing wells of the other driver blocks 30.

The inputs 30a-30g are conveniently connected to the biasing-management stage 34. The biasing-management stage 34 supplies the appropriate biasing voltages as a function of the desired operating conditions.

In particular, as illustrated in FIGS. 5a-5d, when a driver stage 30' belonging to the driver block 30 is selected for an erase operation, the N biasing voltage $V_{NW}$ for the well of an N type is 0 V, and the P biasing voltage $V_{PW}$ for the well of a P type is −HV. The driver block 30 operates in this case in the voltage range [−HV, 0 V].

In detail (FIG. 5a), for the driver stage 30' of the row selected for erase (referred to as selected driver stage), the first control signal GP is selected (GP=0 V) and the second control signal DECS is selected (DECS=−HV). The first NMOS transistor $M_2$, in the conduction state, enables transfer to the output 30h of the voltage of the same second control signal DECS. The control-gate voltage $V_{GC}$ is thus equal to −HV so as to implement the erase operation on the row selected.

As illustrated in FIG. 5b, a further driver stage 30' that shares the input GP with the selected driver stage has the first control signal GP selected (GP=0 V) and the second control signal DECS not selected (DECS=0 V, DECSN=−HV), and thus the second PMOS transistor $M_1$, in the conduction state, enables transfer to the output 30h of the voltage of the third control signal SP. The control-gate voltage $V_{GC}$ is in this case equal to 0 V.

Furthermore (FIG. 5c), the driver stage 30' that shares the input DECS with the selected driver stage, has the first control signal GP not selected (GP=−HV) and the second control signal DECS selected (DECS=−HV). The first PMOS transistor $M_0$, in the conduction state, thus enables transfer to the output 30h of the voltage of the third control signal SP. The control-gate voltage $V_{GC}$ is in this case equal to 0 V.

Finally, the driver stage 30' that does not share any of the two inputs GP and DECS with the selected driver stage (illustrated in FIG. 5d) has the first control signal GP not selected (GP=−HV) and the second control signal DECS not selected (DECS=0 V). Both the first PMOS transistor $M_0$ and the second PMOS transistor $M_1$, in the conduction state, enable transfer to the output 30h of the voltage of the third control signal SP. The control-gate voltage $V_{GC}$ is also in this case equal to 0 V.

As illustrated in FIG. 6, when the driver block 30 is, instead, not selected for the erase operation, the N biasing voltage $V_{NW}$ is equal to the stress-reduction value $V_{PP}$ (at most equal to +HV, in the example), and the P biasing voltage $V_{PW}$ is equal to 0 V. The driver block 30 operates in this case in the voltage range [0 V, +HV].

In detail, the first control signal GP is selected (GP=0 V) for all the rows, and the second control signal DECS is not selected (DECS=0 V). The first and second PMOS transistors $M_0$, $M_1$, in the conduction state, enable transfer to the output 30h of the voltage of the third control signal SP, in this case equal to the stress-reduction value $V_{PP}$. The control-gate voltage $V_{GC}$ is thus equal to the stress-reduction value $V_{PP}$, so as to reduce the stresses that arise during erase on the non-selected rows.

It should be noted that, in the case where the control-gate voltage $V_{GC}$ and the stress-reduction value $V_{PP}$ are equal to the positive high-voltage value +HV, the bulk stresses are reduced substantially to zero. However, the first and second PMOS transistors $M_0$, $M_1$ are subjected to a non-zero gate stress, also on account of the high number of operating cycles required.

It may thus be advantageous, at least in certain operating conditions, to set the stress-reduction value $V_{PP}$ to a value lower than the positive high voltage +HV, as mentioned previously, for example in the range [+HV−3V, +HV], thus ensuring a level of stress that may certainly be withstood both in the memory cells 1 and in the MOSFETs of the control-gate decoder 26. This is based on the stress being dependent on the potential difference.

Figure 7:
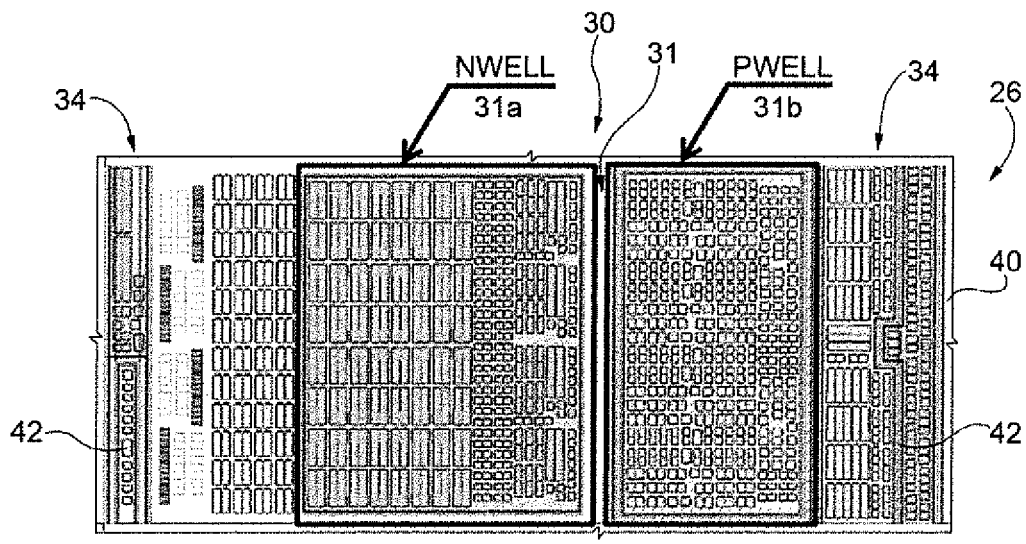
FIG. 7 shows a layout of the non-volatile memory device of FIG. 4.

As illustrated schematically in FIG. 7, a further aspect envisages, in the die 40 of semiconductor material in which the control-gate decoder 26 is provided, the presence of an area 42, common to all the driver blocks 30, integrated in which is the biasing-management stage 34. The biasing-management stage 34 supplies the appropriate biasing voltages as a function of the desired operating conditions and includes appropriate transistor stages for generation of the control signals (in particular, the signals DECS) and of the N biasing voltage $V_{NW}$ and P biasing voltage $V_{PW}$. For each driver block 30, an N well 31a is dedicated to integration of the transistors of a P type, and a P well 31b is dedicated to integration of the transistors of an N type. In particular, as highlighted previously, the biasing wells 31, which are distinct and separate for the various driver blocks 30 of the control-gate decoder 26, include the respective N and P wells 31a, 31b.

The advantages of this approach emerge clearly from the foregoing description. In any case, it is emphasized once again that this approach affords a considerable reduction in the occupation of area as compared to traditional approaches.

There is a reduction of the area dedicated to integration of the memory array 22 that is no longer physically divided into sectors. There is a reduction of the area dedicated to integration of the row-decoding and column-decoding circuits. In this case local bitline decoders are not required for each sector of the memory array, and it is further not required to manage biasing of distinct bulk wells of the memory array.

Furthermore, the approach described affords important improvements of the electrical performance of the non-volatile memory device since there is a reduction in the number of refreshes carried out on the rows of the memory array 22. If, in a traditional approach with 512-row sectors, on each row one refresh is required every 512 erase operations on the other rows (one refresh for each page erase), i.e., with a refresh rate of 1/512, in the approach described, with driver blocks 30 associated to a number of rows equal, for example, to 128, one refresh is carried out every 4 page erase operations, with a refresh rate of 1/(512·4), i.e., a refresh rate reduced by four times with respect to the traditional approach. There is also a reduction in the time for page erase given that the refresh (which involves, for each word of the array, two read operations and one write operation) is carried out at the end of the erase algorithm and thus has an impact on the duration of the same erase. The reduction of the refresh rate is four times, in the example, and implies execution of the refresh on one quarter of the row. The duration of the row refresh thus becomes one quarter, and is reduced by an amount equivalent to the time of erase execution.

A further advantage is achieved during writing cycles in the memory array 22. This is on account of the voltage applied to the bitline BL selected for writing, on the memory cells 1 in the erased state that are located on the same bitline BL, where soft-programming stresses may occur, which are multiplied by the number of rows and the number of cycles.

In a traditional approach, the non-selected rows are driven with a negative voltage (from −1V to −0.5 V), and this limits the voltage that may be applied to the selected row (in the example, 9V to 9.5V), considering the maximum voltage that high-voltage transistors may bear (again considering a high voltage HV of 10 V).

In the approach proposed, instead, thanks to the separation of the wells of driver blocks 30 of the control-gate decoder 26, the non-selected rows and the selected rows may be driven at desired control-gate voltages $V_{CG}$ not necessarily linked to one another and by the maximum voltage that may be withstood by the transistors. In particular, the rows of all the non-selected blocks may be driven at a negative voltage (for example, −1V or −2V), whereas the selected row may be driven at a voltage higher than +HV, for example, +HV+1V given that the other rows of the same block are driven at +1V. This is due to the separate management of biasing of the wells of an N type and P type. For example, the voltage $V_{PW}$ may be set at 1 V, whereas the voltage $V_{NW}$ may be set at 11 V.

The possible soft-programming stresses that are in any case of lower level (which is the lower, the smaller the number of the rows belonging to the same virtual sector), will be limited to the rows associated to the driver block 30 coupled to the selected row.

Figure 8:
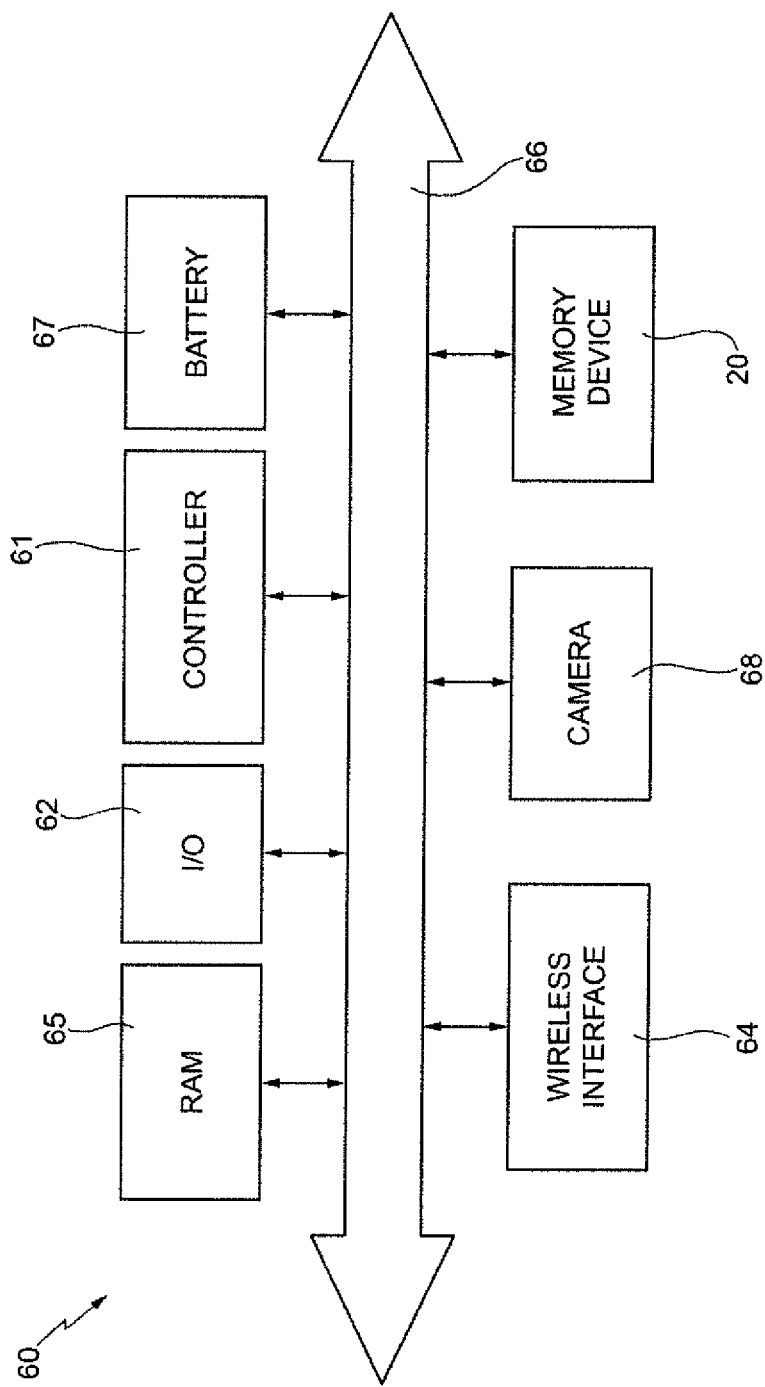
FIG. 8 is a schematic block diagram of an electronic apparatus in which the non-volatile memory device of FIG. 4 may be used.

The advantages previously described make use of the non-volatile memory device 20 particularly advantageous in an electronic apparatus 60, illustrated schematically in FIG. 8. The electronic apparatus 60 may, for example, be a PDA (personal digital assistant), a portable or fixed computer with wireless data-transfer capacity, a cellphone, a digital audio player, a photographic camera or camcorder, or other devices capable of processing, storing, transmitting, and receiving information.

In detail, the electronic apparatus 60 comprises a controller 61 (for example, provided with a microprocessor, a DSP, or a microcontroller), an input/output device 62 (for example, provided with a keypad and a display), for input and display of data. The non-volatile memory device 20 is provided with the memory array 22 described previously. A wireless interface 64, for example an antenna, is for transmitting and receiving data through a radio frequency wireless communication network. A RAM 65 is also includes. All the foregoing are connected through a bus 66. A battery 67 may be used as an electrical power supply source in the electronic apparatus 60, which may further be equipped with a photographic camera or video camera or a camcorder 68.

Finally, it is clear that modifications and variations may be made to what has been described and illustrated herein, without departing from the scope of the present invention, as defined in the annexed claims.

In particular, it is emphasized once again that the approach described may find advantageous application in all non-volatile memory devices in which erase occurs via application of high potential differences with respect to the bulk. For instance, the present approach may find advantageous application in the non-volatile memory device described in U.S. Published Patent Application No. 2014/0097481.

That which is claimed is:

1. A non-volatile memory device comprising:
   a common well configured to be biased at a bulk voltage;
   a memory array in said common well and comprising a plurality of memory cells arranged in rows and columns, each memory cell comprising a pair of current-conduction regions, a control-gate region between the pair of current-conduction regions, and a control-gate terminal coupled to the control-gate region, with the control-gate terminal of a same row of memory cells being coupled together and biased at a respective control-gate voltage; and
   a control-gate decoder configured to select and bias the control-gate regions of the rows of memory cells and the respective control-gate terminals at the respective control-gate voltages;
   said control-gate decoder comprising a plurality of biasing wells and a plurality of driver blocks in the plurality of biasing wells, with each biasing well being separate and distinct from one another and having a respective driver block therein, said plurality of driver blocks configured to supply the respective control-gate voltages to the rows of the memory cells, each driver block comprising a plurality of MOSFET transistors configured to withstand an upper operating voltage limit, and said control-gate decoder is configured, during an erase operation in said memory array, to:
  bias at least one selected row of memory cells at a respective control voltage set at an erase value, which differs from the bulk voltage by a potential difference greater than the upper operating voltage limit, and
  bias remaining rows of said memory array, not selected for erase, at a respective control voltage set at a stress-reduction value, sized with respect to the bulk voltage so as to reduce stress.

2. The non-volatile memory device according to claim 1, wherein each driver block comprises a plurality of driver stages, each driver stage configured to supply the control-gate voltage to a respective row of memory cells, each driver stage comprising a plurality of MOSFETs in a respective biasing well that is separate and distinct from the biasing wells for the plurality of MOSFETs of the other driver stages belonging to the other driver blocks.

3. The non-volatile memory device according to claim 2, wherein each driver stage comprises:
  at least one PMOS transistor and at least one NMOS transistor, each transistor comprising a respective gate terminal configured to receive a biasing voltage, and a respective first conduction terminal coupled to an output to supply the respective control-gate voltage, and a respective second conduction terminal;
  the PMOS transistor and the NMOS transistor being configured to transfer to the output a respective transfer voltage received on the respective second conduction terminal as a function of the biasing voltage; and
  the PMOS transistor and the NMOS transistor are in respective biasing wells for the driver stages of a same driver block, and distinct and separate from the biasing wells for the PMOS and NMOS transistors of the other driver stages of the other driver blocks.

4. The non-volatile memory device according to claim 1, wherein said control-gate decoder further comprises a selection and biasing stage for the plurality of driver blocks, and configured to generate biasing voltages for the respective biasing wells for generation of the control-gate voltages.

5. The non-volatile memory device according to claim 1, wherein a potential difference between the erase value and the stress-reduction value exceeds the upper operating voltage limit.

6. The non-volatile memory device according to claim 1, wherein the stress-reduction value is equal to the bulk voltage.

7. The non-volatile memory device according to claim 1, wherein a potential difference between the stress-reduction value and the bulk voltage is configured so as to not cause stress in the MOSFET transistors of said control-gate decoder.

8. The non-volatile memory device according to claim 7, wherein the plurality of MOSFET transistors of said control-gate decoder are able to withstand the upper operating voltage limit, and the bulk voltage has a positive value equal to the upper operating voltage limit; and the control-gate voltage of the selected row has a negative value equal to the upper operating voltage limit, and the stress-reduction value of the control-gate voltage of the non-selected rows differs from the positive value equal to the upper operating voltage limit by a value between 2 V and 3 V.

9. The non-volatile memory device according to claim 1, wherein memory cells of a same column are associated to a respective bitline; and further comprising a single bitline decoder for said memory array configured to select and bias the bitlines of the columns of memory cells of said memory array at respective bitline voltage values.

10. An electronic apparatus comprising:
  a non-volatile memory device comprising
    a common well configured to be biased at a bulk voltage,
    a memory array in said common well and comprising a plurality of memory cells arranged in rows and columns, each memory cell comprising a pair of current-conduction regions, a control-gate region between the pair of current-conduction regions, and a control-gate terminal coupled to the control-gate region, with the control-gate terminal of a same row of memory cells being coupled together and biased at a respective control-gate voltage, and
    a control-gate decoder configured to select and bias the control-gate regions of the rows of memory cells and the respective control-gate terminals at the respective control-gate voltages,
    said control-gate decoder comprising a plurality of biasing wells and a plurality of driver blocks in the plurality of biasing wells, with each biasing well being separate and distinct from one another and having a respective driver block therein, said plurality of driver blocks configured to supply the respective control-gate voltages to the rows of the memory cells, each driver block comprising a plurality of MOSFET transistors configured to withstand an upper operating voltage limit, and said control-gate decoder is configured, during an erase operation in said memory array, to:
      bias at least one selected row of memory cells at a respective control voltage set at an erase value, which differs from the bulk voltage by a potential difference greater than the upper operating voltage limit, and
      bias remaining rows of said memory array, not selected for erase, at a respective control voltage set at a stress-reduction value, sized with respect to the bulk voltage so as to reduce stress; and
  a controller coupled to said non-volatile memory device and configured to supply address signals for said control-gate decoder.

11. The electronic apparatus according to claim 10, wherein each driver block comprises a plurality of driver stages, each driver stage configured to supply the control-gate voltage to a respective row of memory cells, each driver stage comprising a plurality of MOSFETs in a respective biasing well that is separate and distinct from the biasing wells for the plurality of MOSFETs of the other driver stages belonging to the other driver blocks.

12. The electronic apparatus according to claim 11, wherein each driver stage comprises:
  at least one PMOS transistor and at least one NMOS transistor, each transistor comprising a respective gate terminal configured to receive a biasing voltage, and a respective first conduction terminal coupled to an output to supply the respective control-gate voltage, and a respective second conduction terminal;

the PMOS transistor and the NMOS transistor being configured to transfer to the output a respective transfer voltage received on the respective second conduction terminal as a function of the biasing voltage; and the PMOS transistor and the NMOS transistor are in respective biasing wells for the driver stages of a same driver block, and distinct and separate from the biasing wells for the PMOS and NMOS transistors of the other driver stages of the other driver blocks.

13. The electronic apparatus according to claim 10, wherein said control-gate decoder further comprises a selection and biasing stage for the plurality of driver blocks, and configured to generate biasing voltages for the respective biasing wells for generation of the control-gate voltages.

14. The electronic apparatus according to claim 10, wherein a potential difference between the stress-reduction value and the bulk voltage is configured so as to not cause stress in the MOSFET transistors of said control-gate decoder.

15. The electronic apparatus according to claim 14, wherein the plurality of MOSFET transistors of said control-gate decoder are able to withstand the upper operating voltage limit, and the bulk voltage has a positive value equal to the upper operating voltage limit; and the control-gate voltage of the selected row has a negative value equal to the upper operating voltage limit, and the stress-reduction value of the control-gate voltage of the non-selected rows differs from the positive value equal to the upper operating voltage limit by a value between 2 V and 3 V.

16. The electronic apparatus according to claim 10, wherein memory cells of a same column are associated to a respective bitline; and further comprising a single bitline decoder for said memory array configured to select and bias the bitlines of the columns of memory cells of said memory array at respective bitline voltage values.

17. A method for operating a non-volatile memory device comprising a common well configured to be biased at a bulk voltage; a memory array in the common well and comprising a plurality of memory cells arranged in rows and columns, each memory cell comprising a pair of current-conduction regions, a control-gate region between the pair of current-conduction regions, and a control-gate terminal coupled to the control-gate region, with the control-gate terminal of a same row of memory cells being coupled together and biased at a respective control-gate voltage, the method comprising:

operating a control-gate decoder to select and bias the control-gate regions of the rows of memory cells and the respective control-gate terminals at the respective control-gate voltages;

with the control-gate decoder comprising a plurality of biasing wells and a plurality of driver blocks in the plurality of biasing wells, with each biasing well being separate and distinct from one another and having a respective driver block therein, each driver block comprising a plurality of MOSFET transistors configured to withstand an upper operating voltage limit;

operating the plurality of driver blocks to supply the respective control-gate voltages to the rows of the memory cells; and operating the control-gate decoder during an erase operation in the memory array comprising:

biasing at least one selected row of memory cells at a respective control voltage set at an erase value, which differs from the bulk voltage by a potential difference greater than the upper operating voltage limit, and biasing remaining rows of the memory array, not selected for erase, at a respective control voltage set at a stress-reduction value, sized with respect to the bulk voltage so as to reduce stresses that act on the memory cells of the remaining rows.

18. The method according to claim 17 wherein each driver block comprises a plurality of driver stages, each driver stage to supply the control-gate voltage to a respective row of memory cells, each driver stage comprising a plurality of MOSFETs in a respective biasing well that is separate and distinct from the biasing wells for the plurality of MOSFETs of the other driver stages belonging to the other driver blocks.

19. The method according to claim 18, wherein each driver stage comprises at least one PMOS transistor and at least one NMOS transistor, each transistor comprising a respective gate terminal configured to receive a biasing voltage, and a respective first conduction terminal coupled to an output to supply the respective control-gate voltage, and a respective second conduction terminal, the method comprising:

operating the PMOS transistor and the NMOS transistor to transfer to the output a respective transfer voltage received on the respective second conduction terminal as a function of the biasing voltage, with the PMOS transistor and the NMOS transistor in respective biasing wells for the driver stages of a same driver block, and distinct and separate from the biasing wells for the PMOS and NMOS transistors of the other driver stages of the other driver blocks.

20. The method according to claim 17, wherein the control-gate decoder further comprises a selection and biasing stage for the plurality of driver blocks, the method further comprising operating the selection and biasing stage to generate biasing voltages for the respective biasing wells for generation of the control-gate voltages.

21. The method according to claim 17, wherein a potential difference between the stress-reduction value and the bulk voltage is configured so as to not cause stress in the MOSFET transistors of the control-gate decoder.

22. The method according to claim 21, wherein the plurality of MOSFET transistors of the control-gate decoder are able to withstand the upper operating voltage limit, and the bulk voltage has a positive value equal to the upper operating voltage limit; and the control-gate voltage of the selected row has a negative value equal to the upper operating voltage limit, and the stress-reduction value of the control-gate voltage of the non-selected rows differs from the positive value equal to the upper operating voltage limit by a value between 2 V and 3 V.

23. The method according to claim 17, wherein memory cells of a same column are associated to a respective bitline; and further comprising a single bitline decoder for the memory array configured to select and bias the bitlines of the columns of memory cells of the memory array at respective bitline voltage values.

* * * * *